United States Patent [19]

Eguchi et al.

[11] Patent Number: 4,652,827
[45] Date of Patent: Mar. 24, 1987

[54] NUCLEAR MAGNETIC RESONANCE SPECTROMETER

[75] Inventors: Keiji Eguchi; Kunito Komatsu, both of Tokyo, Japan

[73] Assignee: JEOL Ltd., Tokyo, Japan

[21] Appl. No.: 705,746

[22] Filed: Feb. 26, 1985

[30] Foreign Application Priority Data

Mar. 10, 1984 [JP] Japan .................................. 59-45773

[51] Int. Cl.⁴ ............................................ G01R 33/20
[52] U.S. Cl. ...................................... 324/322; 324/312
[58] Field of Search ............... 324/307, 309, 311, 312, 324/313, 314, 318, 322; 128/653

[56] References Cited

U.S. PATENT DOCUMENTS 3,774,103 11/1973 Laukien ............................... 324/313
4,051,429 9/1977 Imanari et al. ....................... 324/311

OTHER PUBLICATIONS

"Faraday Shield for Surface-Coil Studies of Subcutaneous Tumors" by T. C. Ng et al. *Journal of Magnetic Resonance* 49, 526-529 (1982).

"³¹P Spectroscopic Zeugmatography of Phosphorus Metabolites" by Peter Bendel et al. *Journal of Magnetic Resonance*, 38, 343-356 (1980).

Primary Examiner—Michael J. Tokar
Assistant Examiner—Kevin D. O'Shea
Attorney, Agent, or Firm—Webb, Burden, Robinson & Webb

[57] ABSTRACT

The present invention provides a plurality of transmitter/receiver coils instead of a single transmitter/receiver coil heretofore used. RF pulses containing the resonance frequency of a nuclide to be observed are successively supplied to these coils. The resultant resonance signals are stored and accumulated individually for the separate transmitter/receiver coils to obtain visual information with a high signal-to-noise ratio in a short time.

10 Claims, 12 Drawing Figures

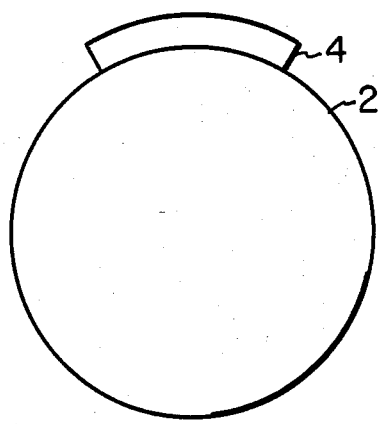
Fig. 2(a)
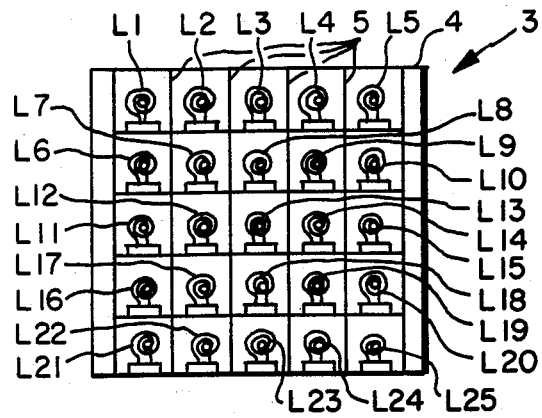
Fig. 2(b)
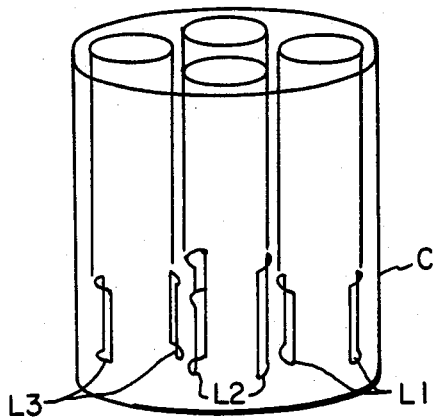
Fig. 5
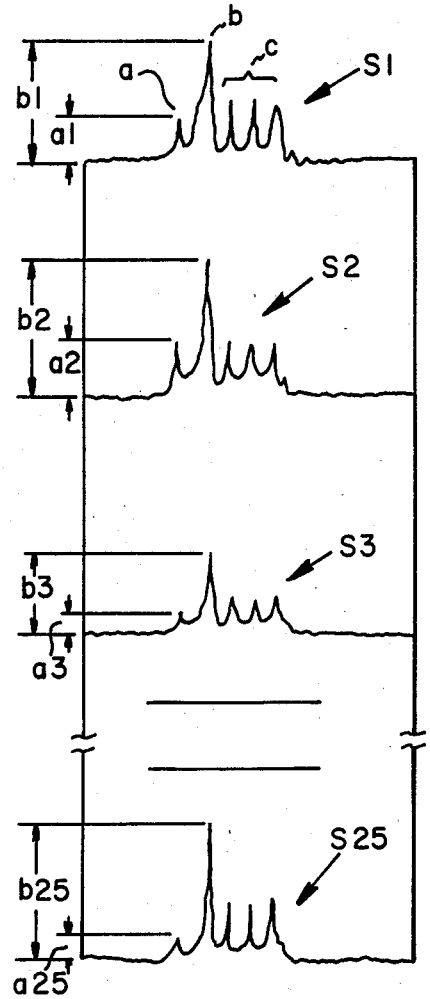
Fig. 6
Fig. 4

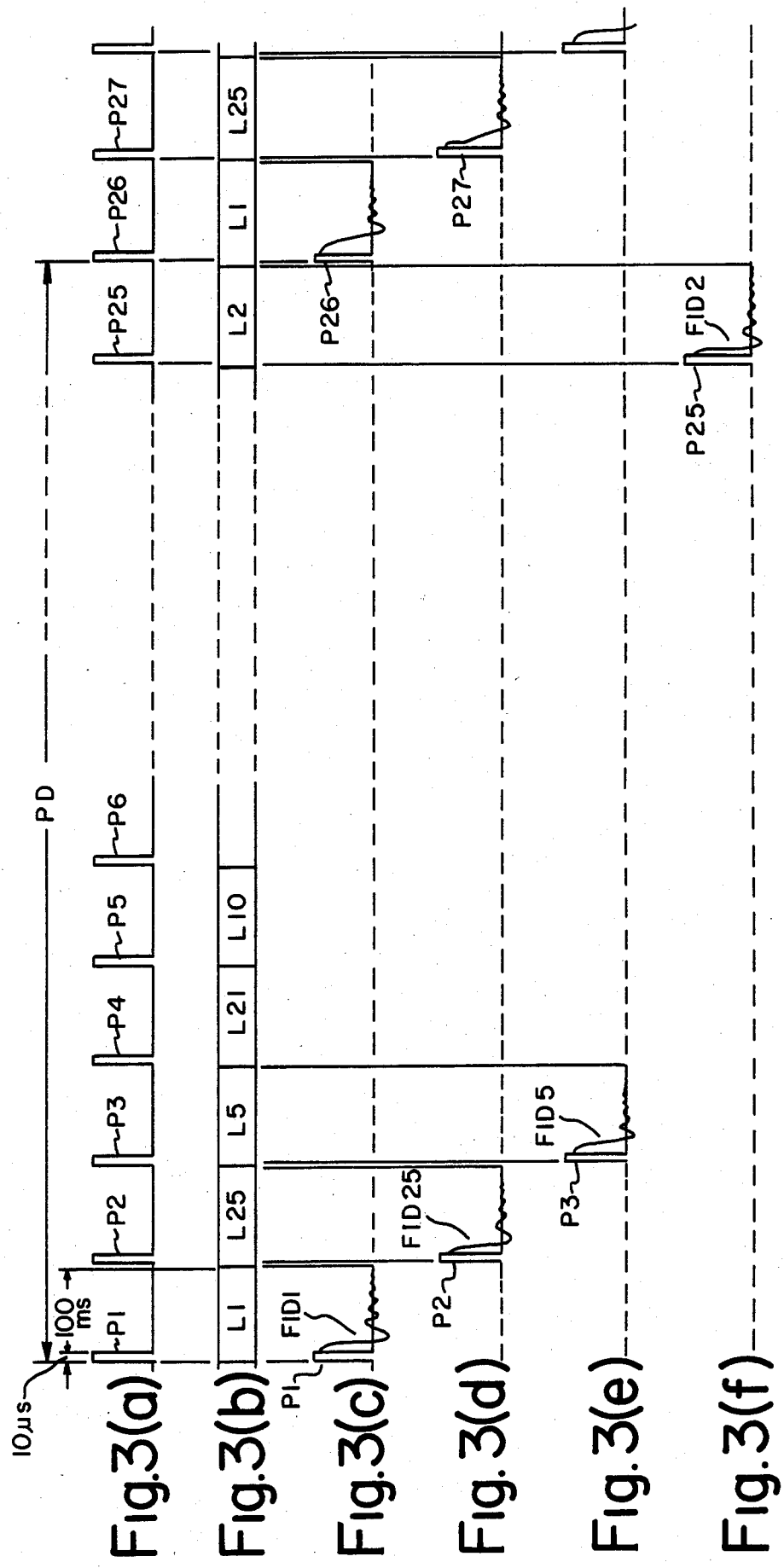

NUCLEAR MAGNETIC RESONANCE SPECTROMETER

BACKGROUND OF THE INVENTION

The present invention relates to a nuclear magnetic resonance spectrometer and, more particularly, to a nuclear magnetic resonance spectrometer adapted to obtain visual information about nuclei exhibiting long relaxation times such as $^{31}P$.

In recent years, many studies have been made of instruments which visualize the spin density distribution of $^1H$ (hydrogen nucleus) on a cross section across a living organism making use of nuclear magnetic resonance. Ordinary nuclear magnetic resonance spectrometers apply a uniform magnetic field to a sample to obtain a resonance signal. In the aforementioned visualizing instruments, a gradient magnetic field having spatially different strengths is superimposed on such a uniform magnetic field that is applied to a subject to be visually observed. A single transmitter/receiver coil which is mounted so as to surround the subject applies an RF magnetic field in the form of a pulse to the subject. After the application, a resonance signal is detected by the coil, and the resultant signal is processed by a computer to obtain the spin density image of an arbitrary cross section across the subject. In this case, the image represents the distribution of the water in the living organism.

Similar measurement of the spin density distribution of other nuclide, such as $^{31}P$, which exists in the living organism may be contemplated as described in "Journal of Magnetic Resonance 38. 343-356 (1980)." However, as well known in the art, the sensitivity with which nuclides other than $^1H$ are detected is much lower than that with which $^1H$ is detected. For example, the sensitivity for $^{31}P$ is lower than the sensitivity for $^1H$ by a factor of about 16. To make up for this poor sensitivity for $^{31}P$, the accumulation period of time is required to be increased by a factor of at least 256. Further, the $^{31}P$ chemical shift splits each peak into a plurality of lower peaks. This also needs an increase in the number of spectra accumulated. Furthermore, for $^{31}P$ the relaxation time is as long as several seconds, during which the next measurement for the accumulation cannot be carried out, thus lenghthening the time taken to make all the measurements. Additionally, the concentration of $^{31}P$ in a living organism is lower than that of $^1H$. For these reasons, the measurement of $^{31}P$ necessitates a time that is one or two thousand times longer than the time required to measure $^1H$.

SUMMARY OF THE INVENTION

It is an object of the present invention to provide a nuclear magnetic resonance spectrometer capable of offering visual information even about nuclides exhibiting long relaxation times in a short measurement time.

Is is another object of the invention to provide a nuclear magnetic resonance spectrometer capable of deriving visible images from a sample under examination with a good signal-to-noise ratio in a short time without the necessity of substantially increasing the number of spectra accumulated.

It is a further object of the invention to provide a nuclear magnetic resonance spectrometer capable of deriving high-quality visible images from a sample under examination without requiring that the gradient of the static magnetic field in which the sample is placed have high linearity.

The nuclear magnetic resonance spectrometer according to the present invention comprises: a means for producing a static magnetic field; a plurality of transmitter/receiver coils mounted in the magnetic field; a means for repeatedly producing an RF pulse containing the resonance frequency of a nuclide under examination; a switching means for permitting the RF pulses to be supplied to the transmitter/receiver coils in turn so that the pulses may be applied to the sample; a receiver circuit for picking up the resonance signals which are detected by the transmitter/receiver coils after the application of the pulses; and means for separately storing the picked up signals derived from the separate transmitter/receiver coils.

Other objects and features of the invention will appear from the ensuing description taken in connection with the accompanying drawings.

BRIEF DESCRIPTION OF THE DRAWINGS

FIGS. 2a and 2b show a coil set 3;

FIGS. 3a to 3f are timing diagrams for illustrating the operation of the spectrometer shown in FIG. 1;

FIG. 4 shows spectra S1-S25 arranged in files for comparison purposes;

FIG. 5 is a view showing the condition in which data is stored in an image memory 15; and FIG. 6 is a perspective view showing the structure of another NMR probe.

PREFERRED EMBODIMENTS OF THE INVENTION

Figure 1:
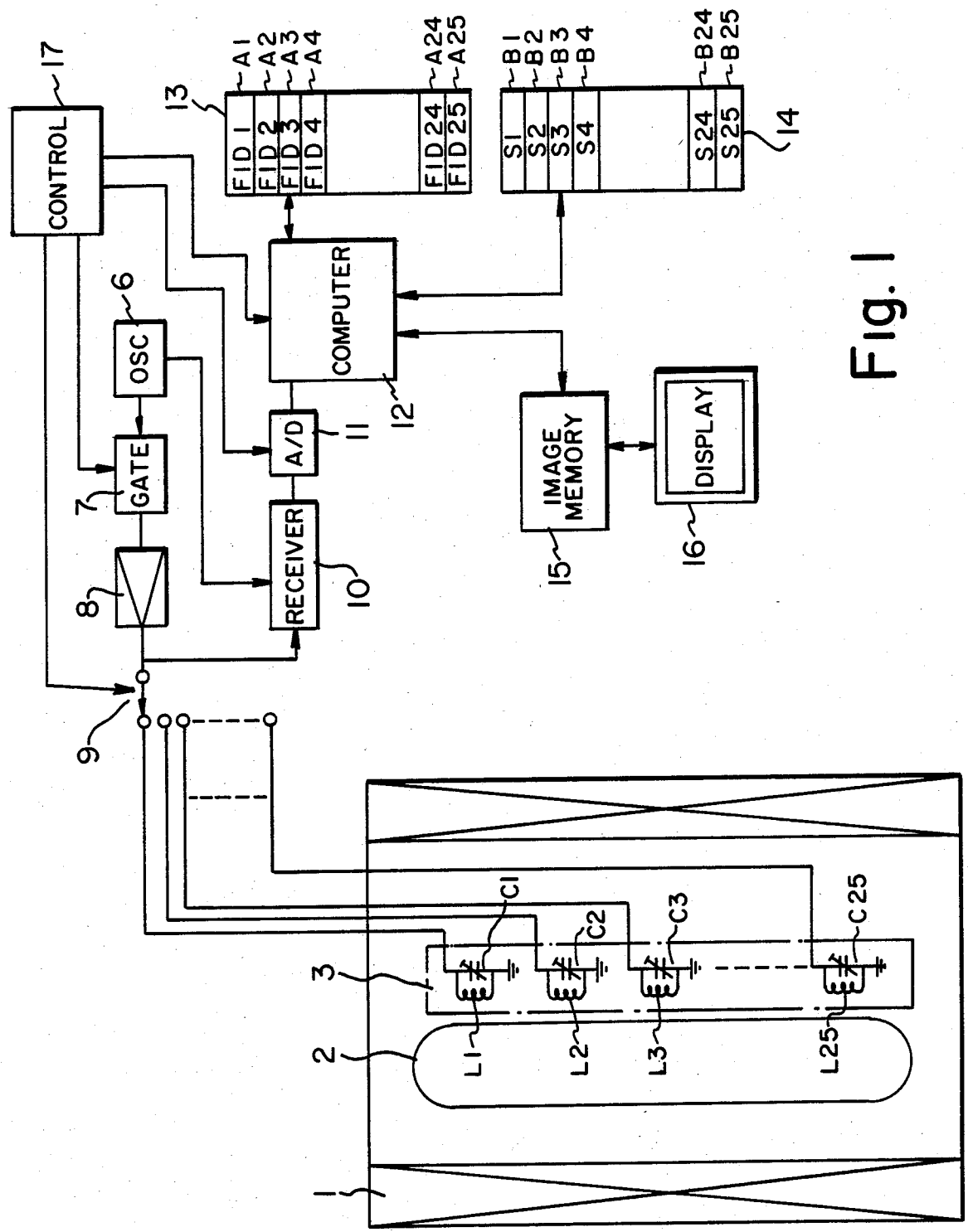
FIG. 1 is a block diagram of the nuclear magnetic resonance spectrometer according to the present invention.

Referring to FIG. 1, there is shown a nuclear magnetic resonance spectrometer embodying the concept of the present invention. This spectrometer has a magnet 1 for producing a homogeneous, static magnetic field, in which a sample 2 to be observed is placed. A coil set 3 is disposed in close proximity to the sample 2. As shown in FIG. 2(a), this coil set 3 comprises a frame 4 that is curved so as to conform to the sample. The inside of the frame 4 is partitioned into 5×5 chambers by shield plates 5, as shown in FIG. 2(b). Small spiral transmitter/receiver coils (surface coils) L1-L25 are disposed in the chambers, respectively, so as to face on the sample 2. Details of the conventional surface coil are described in "Journal of Magnetic Resonance 49, 526-529 (1982)." Turning capacitors C1-C25 are connected with the respective coils L1-L25. The coils L1-L25 and the capacitors C1-C25 are mounted to the shield plates 5 in insulated manner.

Referring back to FIG. 1, an oscillator 6 generates RF waves containing the resonance frequency of the nuclide to be observed, such as $^{31}P$. The RF waves are fed to a gate 7 and appear as RF pulses, which are then amplified by an amplifier 8. The amplified pulses are successively fed to the coils L1-L25 via a selector switch 9. After the application of the RF pulses, free induction decay (FID) signals are induced in the coils which emitted the pulses. The FID signals are received by a receiver circuit 10 and then furnished to a computer 12 via an analog-to-digital converter 11. The obtained data is stored in a memory 13. The data about the FID signals are fetched from the memory 13, and then the computer 12 takes the Fourier transform of the FID data to thereby obtain nuclear magnetic resonance spectra. The data about these spectra is stored in another memory 14. The data about the peak intensities of a specific molecular species is read from the memory 14 and stored as information about the spin density distribution in an image memory 15. The information about the spin density distribution is read from the image memory 15 and fed to a display unit 16, where it is displyed as a visual image. The gate 7 is enabled or disabled by a control circuit 17. The selecting operation of the switch 9 is also controlled by the control circuit 17. Further, the sampling of the free induction decay signals by the A/D converter 11 is made under the control of the control circuit 17. The data about the free induction decay signals is stored in the memory 13 by the computer 12 also under the control of the control circuit 17.

In the structure constructed as described above, an exciting RF pulse having a duration of, say, 10 microseconds ($\mu$s) is applied for one measurement. The resultant free induction decay signal is sampled for a period of 100 milliseconds (ms) after the application of the pulse. FIG. 3(a) shows the exciting RF pulses which appear at the output of the gate 7. The RF pulses having a duration of 10 $\mu$s are successively delivered from the gate 7 at time intervals of about 100 ms. The pulses are fed to the switch 9 via the amplifier 8. The switch 9 is switched sequentially to another state in synchronism with the pulses, as shown in FIG. 3(b). Specifically, the coil L1 is first switched into the circuit. Then, the coil L25 is switched into the circuit. The coil that is next inserted into the circuit is L5. In this way, the next most remote coils are successively switched into the circuit. During one measurement period PD that is set to about 2.5 seconds (s), for example, all 25 coils are each selected once and introduced into the circuit.

When the first pulse P1 is supplied to the coil L1 as shown in FIG. 3(c) and applied to a minute area of the sample which faces on the coil L1, the magnetization vector of the observed nuclide existing in that area is tilted through a given angle. Then, it is restored to its original condition and, at the same time, a free induction decay signal FID1 is induced in the coil L1. This signal FID1 is received by the receiver circuit 10 that is connected to the coil L1 through the switch 9. Then, the information is placed via the computer 12 into the location A1 of the memory 13 which corresponds to the coil L1. It takes about 2.5 seconds, i.e., the relaxation time, for the magnetization vector of the nuclide in the area in contact with the coil L1 to return to its original state after the application of the pulse. Thus, the aforementioned measurement period PD is set to about 2.5 seconds.

After the measurement using the coil L1 is completed in this way, the switch 9 is switched to the coil L25 as shown in FIG. 3(b). Then, the RF pulse P2 is supplied to the coil L25 as shown in FIG. 3(d) to make the same measurement as the foregoing. The resultant signal FID25 is stored in the location A25 of the memory 13 which corresponds to the coil L25.

The next measurement using the coils L5 is shown in FIG. 3(e). Similar measurements using the other coils are carried out until the final one using the coil L2 is performed as shown in FIG. 3(f), thus completing the first series of measurements. At this time, the data items FID1–FID25 derived from the coils are stored in the respective locations A1–A25 of the memory 13.

The second series of measurements starts with the next RF pulse P26. The data about the FID signals obtained from the coils is stored in the respective locations of the memory 13, so that the present data is superimposed on the previous data. Such a series of measurements taking 2.5 seconds is repeatedly performed at appropriate times, and the resulting data is accumulated.

After the data derived by the predetermined number of series of measurements is accumulated in this way, the computer 12 takes the Fourier transform of the accumulated data items FID1–FID25 to obtain NMR spectra S1–S25 regarding $^{31}$P. The data about these spectra is stored in the locations B1–B25 of the memory 14 which are allocated to the respective coils. FIG. 4 shows these spectra S1–S25 arranged in files for comparison purposes. A peak a arising from inorganic phosphorus, a peak b attributable to creatine phosphate, and peaks c resulting from adenosine triphosphate can be seen in each spectrum. If the intensity of the static magnetic field is equal at every location at which the coils are disposed, and if the coils have exactly the same characteristics, then the abscisss of the peaks a, b, c in the spectra S1–S25 would be the same. However, if the intensity of the field at one location differs from that in other locations, the whole spectrum obtained from the coil situated in that location will be shifted. This shift of spectrum due to inhomogeneous intensity of the static field can be removed by shifting the whole spectrum in the opposite direction in such a way that the positions of the peaks contained in the spectrum coincide with the corresponding positions of the peaks in other spectra. Such an amendment can be made by the computer 12.

After the completion of the amendment, the computer 12 extracts the data sets about the intensities b1–b25 of the peaks b in the spectra attributed to creatine phosphate. These data sets are stored in the locations of the image memory 15 which are assigned corresponding to the arrays of the coils L1–L25 to form 5×5 pixels as shown in FIG. 5. These data sets are repeatedly read out at high speed so that they may be presented on the display unit 16. The displayed image has a luminance or hue corresponding to the intensity. Therefore, this image represents the density distribution of creatine phosphate in the portions of the sample on which the coils L1–L25 face. The density distribution of inorganic phosphoric acid can be obtained by extracting the data about the intensities a1–a25 of the peaks a and displaying it on the display unit. In exactly the same manner, the density distribution of adenosine triphosphate can be provided.

It is possible to display a density distribution over an area wider than the coil set 3 by providing a means for moving either the sample or the coil set. In particular, one of the coil set 3 and the sample is moved relative to the other, and measurements are made over a wider area. The obtained data items are combined and displayed to provide a visual display of the density distribution. If the coil set is moved a distance equal to the gap between the successive coils, the portions between the neighboring coils can also be measured, thus enhancing the resolution with which the image is displayed.

In the above example, the order in which the RF pulses are supplied to the coils remains unchanged. If this order is changed for every measurement, the undesirable effects which would be produced by that order can be canceled out. Also, in the above example, the period during which the free induction decay signal is sampled is set to 100 ms, and therefore the number of coils used for each series of measurements for the waiting time of 2.5 seconds is limited to 25. If the sampling period is shortened to 50 ms, for instance, then 50 areas can be measured using 50 coils for the waiting time.

Further, it is to be noted that in the above example, the present invention has been applied to the NMR spectrometer equipped with the visualizing apparatus and employing the surface coils, but the invention can also be applied to an ordinary NMR spectrometer in which a transmitter/receiver coil is wound around each sample tube. In this case, as shown in FIG. 6 in perspective view, an NMR probe base C is designed to receive a plurality of sample tubes. The coils L1, L2, L3, etc. are placed around their respective sample tubes. A known spinning mechanism for rotating a sample tube by means of pressurized air is required to be provided for each sample tube.

The present invention enjoys the following advantages. The novel instrument is provided with a plurality of transmitter/receiver coils. This permits measurements to be made using many coils excluding one coil during the waiting time that begins with the completion of the measurement using the one coil and ends with the instant at which the preparation for the next measurement using that coil is completed. As a result, the time required for the measurements can be shortened greatly.

The example already described in connection with FIG. 1 further yields the following advantages. (1) The use of the surface coils arranged in close proximity to the sample significantly enhances the efficiency of detection as compared with the case where a single coil disposed to surround the sample is employed. For the reason, the number of spectra to be accumulated is not needed to be very large. As such, it is possible to obtain an image with a good signal-to-noise ratio in a short time. (2) The prior art instrument cannot have a good signal-to-noise ratio unless the gradient magnetic field exhibits a good linearity, but it is difficult to achieve such a good linearity. In this respect, the present invention does not utilize a gradient magnetic field and, accordingly, the novel instrument does not suffer from poor signal-to-noise ratio. (3) Since no gradient magnetic field is employed in the invention, the spectra stored in the memory 14 are high-resolution spectra in the same fashion as analyzing nuclear magnetic resonance spectrometers. Such a high-resolution spectrum enables analysis of the constituents of the sample. (4) In the present example, the shield plates 5 are disposed among the coils to thereby prevent undesirable interference among the coils.

What is claimed is:

1. A nuclear magnetic resonance spectrometer for gathering a density distribution over an area comprising:
   a means for producing a static magnetic field;
   a plurality of transmitter/receiver coils arranged in a two-dimensional array placed in the magnetic field;
   a means for repeatedly producing an RF pulse containing the resonance frequency of a nuclide to be observed;
   a switching means for allowing the RF pulses to be successively supplied to the coils and applied to a sample under examination;
   a receiver circuit for picking up the resonance signals detected by the coils after the application of the RF pulses; and
   means for separately storing the data about the picked up resonance signals for the different coils in a two-dimensional matrix.

2. The nuclear magnetic resonance spectrometer of claim 1, wherein the transmitter/receiver coils are arranged in close proximity to the sample under examination and along the surface of the sample.

3. The nuclear magnetic resonance spectrometer of claim 1, wherein shield members are mounted among the transmitter/receiver coils to prevent interference among the coils.

4. The nuclear magnetic resonance spectrometer of claim 2, wherein shield members are mounted among the transmitter/receiver coils to prevent interference among the coils.

5. The nuclear magnetic resonance spectrometer of claim 1, wherein the means for storing the data has an accumulation function.

6. The nuclear magnetic resonance spectrometer of claim 2, wherein the means for storing the data has an accumulation function.

7. The nuclear magnetic resonance spectrometer of claim 3, wherein the means for storing the data has an accumulation function.

8. The nuclear magnetic resonance spectrometer of claim 5, wherein the order in which the RF pulses are supplied to the transmitter/receiver coils is changed for every accumulation.

9. The nuclear magnetic resonance spectrometer of claim 6, wherein the order in which the RF pulses are supplied to the transmitter/receiver coils is changed for every accumulation.

10. The nuclear magnetic resonance spectrometer of claim 7, wherein the order in which the RF pulses are supplied to the transmitter/receiver coils is changed for every accumulation.

* * * * *